(12) United States Patent
Winter et al.

(10) Patent No.: US 11,377,454 B2
(45) Date of Patent: Jul. 5, 2022

(54) ALUMINUM PRECURSOR AND PROCESS FOR THE GENERATION OF METAL-CONTAINING FILMS

(71) Applicants: BASF SE, Ludwigshafen am Rhein (DE); Wayne State University, Detroit, MI (US)

(72) Inventors: Charles Hartger Winter, Detroit, MI (US); Kyle Blakeney, Detroit, MI (US); Lukas Mayr, Ludwigshafen (DE); David Dominique Schweinfurth, Ludwigshafen (DE); Sabine Weiguny, Ludwigshafen (DE); Daniel Waldmann, Ludwigshafen (DE)

(73) Assignees: BASF SE, Ludwigshafen am Rhein (DE); Wayne State University, Detroit, MI (US)

( * ) Notice: Subject to any disclaimer, the term of this patent is extended or adjusted under 35 U.S.C. 154(b) by 0 days.

(21) Appl. No.: 17/046,208

(22) PCT Filed: Apr. 10, 2019

(86) PCT No.: PCT/EP2019/059023
§ 371 (c)(1),
(2) Date: Oct. 8, 2020

(87) PCT Pub. No.: WO2019/201692
PCT Pub. Date: Oct. 24, 2019

(65) Prior Publication Data
US 2021/0024549 A1 Jan. 28, 2021

(30) Foreign Application Priority Data
Apr. 17, 2018 (EP) .................................... 18167721

(51) Int. Cl.
*C07F 5/06* (2006.01)
*C23C 16/30* (2006.01)
*C23C 16/455* (2006.01)

(52) U.S. Cl.
CPC .............. *C07F 5/067* (2013.01); *C23C 16/30* (2013.01); *C23C 16/45553* (2013.01)

(58) Field of Classification Search
None
See application file for complete search history.

(56) References Cited

U.S. PATENT DOCUMENTS

2009/0226612 A1    9/2009    Ogawa et al.

FOREIGN PATENT DOCUMENTS

WO    2013070702 A1    5/2013

OTHER PUBLICATIONS

Gardiner et al; Secondary Amine Stabilized Aluminum Hydrides Derived from N,N'-Di-tert-butylethylenediamines; Inorg. Chem. 1996. 35, pp. 1349-1354. (Year: 1996).*
Arduengo et al; A Stable Carbene-Alane Adduct; J. Am. Chem. Soc. 1992, 114, pp. 9724-9725. (Year: 1992).*
International Search Report and Written Opinion for corresponding PCT/EP2019/059023 dated Jul. 4, 2019,7 pages.
Blakeney, et al., "Atomic Layer Deposition of Aluminum Metal Films Using a Thermally Stable Aluminum Hydride Reducing Agent", Chemistry of Materials, vol. 30, Issue 6, 2018, pp. 1844-1848.
European Search Report for EP Patent Application No. 18167721.2, dated Oct. 22, 2018, 2 pages.
Steven M. George, "Atomic Layer Deposition: An Overview", Chemical Reviews, vol. 110, Issue 1, Nov. 30, 2009, pp. 111-131.
Yang, et al., "Direct-liquid-evaporation chemical vapor deposition of smooth, highly conformal cobalt and cobalt nitride thin films", Journal of Materials Chemistry C, vol. 46, Issue 3, Nov. 3, 2015, pp. 12098-12106.

* cited by examiner

*Primary Examiner* — Joseph R Kosack
(74) *Attorney, Agent, or Firm* — Armstrong Teasdale LLP

(57) ABSTRACT

The present disclosure is in the field of processes for the generation of thin inorganic films on substrates, in particular atomic layer deposition processes. Described herein is a process for preparing metal-containing films including:

(a) depositing a metal-containing compound from the gaseous state onto a solid substrate, and
(b) bringing the solid substrate with the deposited metal-containing compound in contact with a compound of general formula (I)

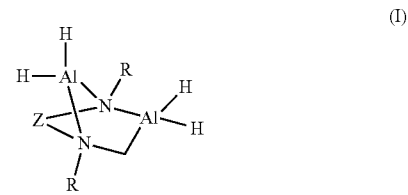

wherein Z is a $C_2$-$C_4$ alkylene group, and
R is hydrogen, an alkyl group, an alkenyl group, an aryl group, or a silyl group.

14 Claims, 2 Drawing Sheets

ALUMINUM PRECURSOR AND PROCESS FOR THE GENERATION OF METAL-CONTAINING FILMS

CROSS-REFERENCE TO RELATED APPLICATIONS

This application is a U.S. National Phase Application of International Patent Application No. PCT/EP2019/059023, filed on Apr. 10, 2019, which claims the benefit of priority to European Patent Application Number 18167721.2, filed Apr. 17, 2018, the entire contents of which are hereby incorporated by reference herein.

The present invention is in the field of processes for the generation of thin inorganic films on substrates, in particular atomic layer deposition processes.

With the ongoing miniaturization, e.g. in the semiconductor industry, the need for thin inorganic films on substrates increases while the requirements on the quality of such films become stricter. Thin metal films serve different purposes such as barrier layers, conducting features, or capping layers. Several methods for the generation of metal films are known. One of them is the deposition of film forming compounds from the gaseous state on a substrate. In order to bring metal atoms into the gaseous state at moderate temperatures, it is necessary to provide volatile precursors, e.g. by complexation of the metals with suitable ligands. In order to convert deposited metal complexes to metal films, it is usually necessary to expose the deposited metal complex to a reducing agent.

Typically, hydrogen gas is used to convert deposited metal complexes to metal films. While hydrogen works reasonably well as reducing agent for relatively noble metals like copper or silver, it does not yield satisfactory results for more electropositive metals such as titanium or aluminum.

WO 2013/070 702 A1 discloses a process for depositing metal films employing aluminum hydride which is coordinated by a diamine as reducing agent. While this reducing agent generally yields good results, for some demanding applications, higher vapor pressures, stability and/or reduction potential is required.

It was therefore an object of the present invention to provide reducing agents, which are capable of reducing surface-bound metal atoms to the metallic state leaving less impurity in the metal film. The reducing agents should be easy to handle; in particular, it should be possible to vaporize them with as little decomposition as possible. Further, the reducing agent should not decompose at the deposition surface under process conditions but at the same time it should have enough reactivity to participate in a reductive surface reaction. All reaction by-products should be volatile to avoid film contamination. In addition, it should be possible to adjust the process such that metal atoms in the reducing agents are either volatile or are incorporated in the film. Furthermore, the reducing agent should be versatile, so it can be applied to a broad range of different metals including electropositive metals.

These objects were achieved by a process for preparing metal-containing films comprising
(a) depositing a metal-containing compound from the gaseous state onto a solid substrate and
(b) bringing the solid substrate with the deposited metal-containing compound in contact with a compound of general formula (I)

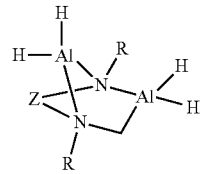

wherein Z is a $C_2$-$C_4$ alkylene group,
R is hydrogen, an alkyl group, an alkenyl group, an aryl group, or a silyl group.

The present invention further relates to a compound of general formula (I), wherein Z is a $C_2$-$C_4$ alkylene group, and
R is hydrogen, an alkyl group, an alkenyl group, an aryl group, or a silyl group.

Preferred embodiments of the present invention can be found in the description and the claims. Combinations of different embodiments fall within the scope of the present invention.

The process according to the present invention includes depositing a metal-containing compound from the gaseous state onto a solid substrate. The metal-containing compound contains at least one metal atom. Metals include Li, Be, Na, Mg, Al, K, Ca, Sc, Ti, V, Cr, Mn, Fe, Co, Ni, Cu, Zn, Ga, Rb, Sr, Y, Zr, Nb, Mo, Tc, Ru, Rh, Pd, Ag, Cd, In, Sn, Cs, Ba, La, Ce, Pr, Nd, Pm, Sm, Eu, Gd, Tb, Dy, Ho, Er, Tm, Yb, Lu, Hf, Ta, W, Re, Os Ir, Pt, Au, Hg, Tl, Bi. Preferably, the metal-containing compound contains a metal which is more electropositive than Cu, more preferably more electropositive than Ni. In particular, the metal-containing compound contains Ti, Ta, Mn, Mo, W, or Al. It is possible that more than one metal-containing compound is deposited on the surface, either simultaneously or consecutively. If more than one metal-containing compound is deposited on a solid substrate it is possible that all metal-containing compounds contain the same metal or different ones, preferably they contain different metals.

Any metal-containing compound, which can be brought into the gaseous state, is suitable. These compounds include metal alkyls such as dimethyl zinc, trimethylaluminum; metal alkoxylates such as tetramethoxy silicon, tetra-iso-propoxy zirconium or tetra-iso-propoxy titanium; metal cyclopentadienyl complexes like pentamethylcyclopendienyl-trimethoxy titanium or di(ethylcycopentadienyl) manganese; metal carbenes such as tris(neopentyl)neopentylidene tantalum or bisimidazolidinyliden ruthenium chloride; metal halides such as aluminum trichloride, tantalum pentachloride, titanium tetrachloride, molybdenum pentachloride, or tungsten hexachloride; carbon monoxide complexes like hexacarbonyl chromium or tetracarbonyl nickel; amine complexes such as bis(tert-butylimino)bis(dimethylamino) molybdenum, bis(tert-butylimino)bis(dimethylamino)tungsten or tetrakis(dimethylamino)titanium; diketonate complexes such as tris(acetylacetonato)aluminum or bis(2,2,6, 6-tetramethyl-3,5-heptanedionato) manganese. Metal halides are preferred, in particular aluminum chloride, aluminum bromide and aluminum iodide. It is preferred that the molecular weight of the metal-containing compound is up to 1000 g/mol, more preferred up to 800 g/mol, in particular up to 600 g/mol, such as up to 500 g/mol.

The solid substrate can be any solid material. These include for example metals, semimetals, oxides, nitrides, and polymers. It is also possible that the substrate is a mixture of different materials. Examples for metals are aluminum, steel, zinc, and copper. Examples for semimetals are silicon, germanium, and gallium arsenide. Examples for oxides are silicon dioxide, titanium dioxide, and zinc oxide. Examples for nitrides are silicon nitride, aluminum nitride, titanium nitride, and gallium nitride. Examples for polymers are polyethylene terephthalate (PET), polyethylene naphthalene-dicarboxylic acid (PEN), and polyamides.

The solid substrate can have any shape. These include sheet plates, films, fibers, particles of various sizes, and substrates with trenches or other indentations. The solid substrate can be of any size. If the solid substrate has a particle shape, the size of particles can range from below 100 nm to several centimeters, preferably from 1 µm to 1 mm. In order to avoid particles or fibers to stick to each other while the metal-containing compound is deposited onto them, it is preferably to keep them in motion. This can, for example, be achieved by stirring, by rotating drums, or by fluidized bed techniques.

According to the present invention the solid substrate with the deposited metal-containing compound is brought in contact with a compound of general formula (I). Typically, the compound of general formula (I) acts as a reducing agent on the deposited metal-containing compound. The metal-containing compound is usually reduced to a metal, a metal nitride, a metal carbide, a metal carbonitride, a metal alloy, an intermetallic compound or mixtures thereof. Therefore, the process for preparing metal-containing films is preferably a process for preparing metal films, metal nitride films, metal carbide films, metal carbonitride films, metal alloy films, intermetallic compound films or films containing mixtures thereof. Metal films in the context of the present invention are metal-containing films with high electrical conductivity, usually at least $10^4$ S/m, preferably at least $10^5$ S/m, in particular at least $10^6$ S/m.

The compound of general formula (I) has a low tendency to form a permanent bond with the surface of the solid substrate with the deposited metal-containing compound. As a result, the metal-containing film hardly gets contaminated with the reaction by-products of the compound of general formula (I). Preferably, the metal-containing film contains in sum less than 5 weight-% nitrogen, more preferably less than 1 wt.-%, in particular less than 0.5 wt.-%, such as less than 0.2 wt.-%.

R in the compound of general formula (I) is hydrogen, an alkyl group, an alkenyl group, an aryl group, or a silyl group. The two R can be the same or different to each other.

An alkyl group can be linear or branched. Examples for a linear alkyl group are methyl, ethyl, n-propyl, n-butyl, n-pentyl, n-hexyl, n-heptyl, n-octyl, n-nonyl, n-decyl. Examples for a branched alkyl group are iso-propyl, iso-butyl, sec-butyl, tert-butyl, 2-methyl-pentyl, neo-pentyl, 2-ethylhexyl, cyclopropyl, cyclohexyl, indanyl, norbornyl. Preferably, the alkyl group is a $C_1$ to $C_8$ alkyl group, more preferably a $C_1$ to $C_6$ alkyl group, in particular a $C_1$ to $C_4$ alkyl group, such as methyl, ethyl, iso-propyl or tert-butyl.

An alkenyl group contains at least one carbon-carbon double bond. The double bond can include the carbon atom with which R is bound to the rest of the molecule, or it can be placed further away from the place where R is bound to the rest of the molecule. Alkenyl groups can be linear or branched. Examples for linear alkenyl groups in which the double bond includes the carbon atom with which R is bound to the rest of the molecule include 1-ethenyl, 1-propenyl, 1-n-butenyl, 1-n-pentenyl, 1-n-hexenyl, 1-n-heptenyl, 1-n-octenyl. Examples for linear alkenyl groups in which the double bond is placed further away from the place where R is bound to the rest of the molecule include 1-n-propen-3-yl, 2-buten-1-yl, 1-buten-3-yl, 1-buten-4-yl, 1-hexen-6-yl. Examples for branched alkenyl groups in which the double bond includes the carbon atom with which R is bound to the rest of the molecule include 1-propen-2-yl, 1-n-buten-2-yl, 2-buten-2-yl, cyclopenten-1-yl, cyclohexen-1-yl. Examples for branched alkenyl groups in which the double bond is placed further away from the place where R is bound to the rest of the molecule include 2-methyl-1-buten-4-yl, cyclopenten-3-yl, cyclohexene-3-yl. Examples for an alkenyl group with more than one double bonds include 1,3-butadien-1-yl, 1,3-butadien-2-yl, cylopentadien-5-yl.

Aryl groups include aromatic hydrocarbons such as phenyl, naphthalyl, anthrancenyl, phenanthrenyl groups and heteroaromatic groups such as pyrryl, furanyl, thienyl, pyridinyl, quinoyl, benzofuryl, benzothiophenyl, thienothienyl. Several of these groups or combinations of these groups are also possible like biphenyl, thienophenyl or furanylthienyl. Aryl groups can be substituted for example by halogens like fluoride, chloride, bromide, iodide; by pseudohalogens like cyanide, cyanate, thiocyanate; by alcohols; alkyl chains or alkoxy chains. Aromatic hydrocarbons are preferred, phenyl is more preferred.

A silyl group is a silicon atom with typically three substituents. Preferably a silyl group has the formula $SiX_3$, wherein X is independent of each other hydrogen, an alkyl group, an aryl group or a silyl group. It is possible that all three X are the same or that two A are the same and the remaining X is different or that all three X are different to each other, preferably all X are the same. Alkyl and aryl groups are as described above. Examples for silyl groups include $SiH_3$, methylsilyl, trimethylsilyl, triethylsilyl, tri-n-propylsilyl, tri-iso-propylsilyl, tricyclohexylsilyl, dimethyl-tert-butylsilyl, dimethylcyclohexylsilyl, methyl-di-iso-propylsilyl, triphenylsilyl, phenylsilyl, dimethylphenylsilyl, pentamethyldisilyl.

Preferably, R bears no hydrogen atom in the 1-position, i.e. R bears no hydrogen atom which is bonded to the atom which is bonded to the nitrogen atom. Examples are alkyl group bearing two alkyl side groups in the 1-position, i.e. 1,1-dialkylalkyl, such as tert-butyl, 1,1-dimethylpropyl; alkyl groups with two halogens in the 1-position such as trifluoromethyl, trichloromethyl, 1,1-difluoroethyl; trialkyl-silyl groups such as trimethylsilyl, triethylsilyl, dimethyl-tert-butylsilyl; aryl groups, in particular phenyl or alkyl-substituted phenyl such as 2,6-diisopropylphenyl, 2,4,6-triisopropylphenyl. Alkyl groups bearing no hydrogen atom in the 1-position are particularly preferred.

Z in the compound of general formula (I) is a $C_2$-$C_4$ alkylene group including ethylene, i.e. —$CH_2$—$CH_2$—, 1,3-propylene, i.e. —$CH_2$—$CH_2$—$CH_2$—, and 1,4-butylene, i.e. —$CH_2$—$CH_2$—$CH_2$—$CH_2$—, preferably ethylene. The alkylene group can be substituted by halogens, alkyl groups, alkenyl groups, aryl groups or silyl groups as described above.

The compound of general formula (I) preferably has a molecular weight of not more than 1000 g/mol, more preferably not more than 800 g/mol, even more preferably not more than 600 g/mol, in particular not more than 500 g/mol. The compound of general formula (I) preferably has a decomposition temperature of at least 80° C., more preferably at least 100° C., in particular at least 120° C., such as at least 150° C. Often, the decomposition temperature is not more than 250° C. The compound of general formula (I) has a high vapor pressure. Preferably, the vapor pressure is at least 1 mbar at a temperature of 200° C., more preferably at 150° C., in particular at 120° C. Usually, the temperature at which the vapor pressure is 1 mbar is at least 50° C.

Some preferred examples of compounds of general formula (I) are shown in the following table.

TABLE 1

Me stands for methyl, t-Bu for tert-butyl, TMS for trimethylsilyl, TES for triethylsilyl, TBDMS for tert-butyl-dimethylsilyl, Ph for phenyl.

| No. | R | Z |
|---|---|---|
| I-1 | t-Bu | —CH$_2$—CH$_2$— |
| I-2 | TMS | —CH$_2$—CH$_2$— |
| I-3 | TES | —CH$_2$—CH$_2$— |
| I-4 | TBDMS | —CH$_2$—CH$_2$— |
| I-5 | CF$_3$ | —CH$_2$—CH$_2$— |
| I-6 | Ph | —CH$_2$—CH$_2$— |
| I-7 | t-Bu | —CH$_2$—CH$_2$—CH$_2$— |
| I-8 | TMS | —CH$_2$—CH$_2$—CH$_2$— |
| I-9 | TES | —CH$_2$—CH$_2$—CH$_2$— |
| I-10 | TBDMS | —CH$_2$—CH$_2$—CH$_2$— |
| I-11 | CF$_3$ | —CH$_2$—CH$_2$—CH$_2$— |
| I-12 | Ph | —CH$_2$—CH$_2$—CH$_2$— |
| I-13 | t-Bu | —CH$_2$—CH$_2$—CH$_2$—CH$_2$— |
| I-14 | TMS | —CH$_2$—CH$_2$—CH$_2$—CH$_2$— |
| I-15 | TES | —CH$_2$—CH$_2$—CH$_2$—CH$_2$— |
| I-16 | TBDMS | —CH$_2$—CH$_2$—CH$_2$—CH$_2$— |
| I-17 | CF$_3$ | —CH$_2$—CH$_2$—CH$_2$—CH$_2$— |
| I-18 | Ph | —CH$_2$—CH$_2$—CH$_2$—CH$_2$— |
| I-19 | t-Bu | —CH(CH$_3$)—CH$_2$— |
| I-20 | t-Bu | —CH(CH$_3$)—CH(CH$_3$)— |
| I-21 | t-Bu | —CF$_2$—CF$_2$— |
| I-22 | Me t-Bu | —CH$_2$—CH$_2$— |
| I-23 | TMS t-Bu | —CH$_2$—CH$_2$—CH$_2$— |
| I-24 | CF$_3$ Ph | —CH$_2$—CH$_2$— |
| I-25 | TMS TES | —CH$_2$—CH$_2$— |

The compound of general formula (I) can be synthesized by heating a N-heterocyclic carbene with two equivalents of an aluminum hydride complex, for example aluminum hydride coordinated by trimethylamine. The synthesis of various N-heterocyclic carbenes is well known from the prior art. The following equation shows the synthesis.

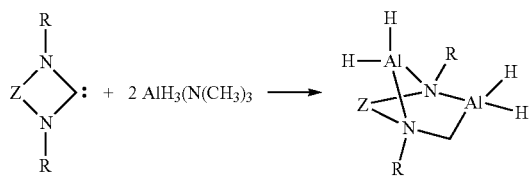

The reaction can be done in a solvent of low polarity, for example aromatic hydrocarbons such as toluene. The reaction temperature is typically 25 to 150° C., preferably 60 to 120° C., the reaction time is typically 10 min to 2 h, preferably 20 to 40 min.

Both the metal-containing compound and the compound of general formula (I) used in the process according to the present invention are used at high purity to achieve the best results. High purity means that the substance used contains at least 90 wt.-% metal-containing compound or compound of general formula (I), preferably at least 95 wt.-%, more preferably at least 98 wt.-%, in particular at least 99 wt.-%. The purity can be determined by elemental analysis according to DIN 51721 (Prufung fester Brennstoffe—Bestimmung des Gehaltes an Kohlenstoff und Wasserstoff—Verfahren nach Radmacher-Hoverath, August 2001).

The metal-containing compound or the compound of general formula (I) can be deposited or brought in contact with the solid substrate from the gaseous state. They can be brought into the gaseous state for example by heating them to elevated temperatures. In any case a temperature below the decomposition temperature of the metal-containing compound or the compound of general formula (I) has to be chosen. In this context, the oxidation of the compound of general formula (I) is not regarded as decomposition. A decomposition is a reaction in which the metal-containing compound or the compound of general formula (I) is converted to an undefined variety of different compounds. Preferably, the heating temperature ranges from 0° C. to 300° C., more preferably from 10° C. to 250° C., even more preferably from 20° C. to 200° C., in particular from 30° C. to 150° C.

Another way of bringing the metal-containing compound or the compound of general formula (I) into the gaseous state is direct liquid injection (DLI) as described for example in US 2009/0 226 612 A1. In this method the metal-containing compound or the compound of general formula (I) is typically dissolved in a solvent and sprayed in a carrier gas or vacuum. If the vapor pressure of metal-containing compound or the compound of general formula (I) and the temperature are sufficiently high and the pressure is sufficiently low the metal-containing compound or the compound of general formula (I) is brought into the gaseous state. Various solvents can be used provided that the metal-containing compound or the compound of general formula (I) shows sufficient solubility in that solvent such as at least 1 g/l, preferably at least 10 g/l, more preferably at least 100 g/l. Examples for these solvents are coordinating solvents such as tetrahydrofuran, dioxane, diethoxyethane, pyridine or non-coordinating solvents such as hexane, heptane, benzene, toluene, or xylene. Solvent mixtures are also suitable.

Alternatively, the metal-containing compound or the compound of general formula (I) can be brought into the gaseous state by direct liquid evaporation (DLE) as described for example by J. Yang et al. (Journal of Materials Chemistry, 2015). In this method, the metal-containing compound or the compound of general formula (I) is mixed with a solvent, for example a hydrocarbon such as tetradecane, and heated below the boiling point of the solvent. By evaporation of the solvent, the metal-containing compound or the compound of general formula (I) is brought into the gaseous state. This method has the advantage that no particulate contaminants are formed on the surface.

It is preferred to bring the metal-containing compound or the compound of general formula (I) into the gaseous state at decreased pressure. In this way, the process can usually be performed at lower heating temperatures leading to decreased decomposition of the metal-containing compound or the compound of general formula (I). It is also possible to use increased pressure to push the metal-containing compound or the compound of general formula (I) in the gaseous state towards the solid substrate. Often, an inert gas, such as nitrogen or argon, is used as carrier gas for this purpose. Preferably, the pressure is 10 bar to $10^{-7}$ mbar, more preferably 1 bar to $10^{-3}$ mbar, in particular 1 to 0.01 mbar, such as 0.1 mbar.

It is also possible that the metal-containing compound or the compound of general formula (I) is deposited or brought in contact with the solid substrate from solution. Deposition from solution is advantageous for compounds which are not stable enough for evaporation. However, the solution needs to have a high purity to avoid undesirable contaminations on the surface. Deposition from solution usually requires a solvent which does not react with the metal-containing compound or the compound of general formula (I). Examples for solvents are ethers like diethyl ether, methyl-tert-butylether, tetrahydrofuran, dioxane; ketones like acetone, methylethylketone, cyclopentanone; esters like ethyl acetate; lactones like 4-butyrolactone; organic carbonates like diethylcarbonate, ethylene carbonate, vinylenecarbonate; aromatic hydrocarbons like benzene, toluene, xylene, mesitylene, ethylbenzene, styrene; aliphatic hydrocarbons like n-pentane, n-hexane, cyclohexane, iso-undecane, decaline, hexadecane. Ethers are preferred, in particular tetrahydrofuran. The concentration of the metal-containing compound or the compound of general formula (I) depend among others on the reactivity and the desired reaction time. Typically, the concentration is 0.1 mmol/l to 10 mol/l, preferably 1 mmol/l to 1 mol/l, in particular 10 to 100 mmol/l.

For the deposition process, it is possible to sequentially contact the solid substrate with a metal-containing compound and with a solution containing a compound of general formula (I). Bringing the solid substrate in contact to the solutions can be performed in various ways, for example by dip-coating or spin-coating. Often it is useful to remove excess metal-containing compound or the compound of general formula (I), for example by rinsing with the pristine solvent. The reaction temperature for solution deposition is typically lower than for deposition from the gaseous or aerosol phase, typically 20 to 150° C., preferably 50 to 120° C., in particular 60 to 100° C. In some cases it can be useful to anneal the film after several deposition steps, for example by heating to temperatures of 150 to 500° C., preferably 200 to 450° C., for 10 to 30 minutes.

The deposition of the metal-containing compound takes place if the substrate comes in contact with the metal-containing compound. Generally, the deposition process can be conducted in two different ways: either the substrate is heated above or below the decomposition temperature of the metal-containing compound. If the substrate is heated above the decomposition temperature of the metal-containing compound, the metal-containing compound continuously decomposes on the surface of the solid substrate as long as more metal-containing compound in the gaseous state reaches the surface of the solid substrate. This process is typically called chemical vapor deposition (CVD). Usually, an inorganic layer of homogeneous composition, e.g. the metal oxide or nitride, is formed on the solid substrate as the organic material is desorbed from the metal M. This inorganic layer is then converted to the metal layer by bringing it in contact with the compound of general formula (I). Typically the solid substrate is heated to a temperature in the range of 300 to 1000° C., preferably in the range of 350 to 600° C.

Alternatively, the substrate is below the decomposition temperature of the metal-containing compound. Typically, the solid substrate is at a temperature equal to or slightly above the temperature of the place where the metal-containing compound is brought into the gaseous state, often at room temperature or only slightly above. Preferably, the temperature of the substrate is 5° C. to 40° C. higher than the place where the metal-containing compound is brought into the gaseous state, for example 20° C. Preferably, the temperature of the substrate is from room temperature to 400° C., more preferably from 100 to 300° C., such as 150 to 220° C.

The deposition of metal-containing compound onto the solid substrate is either a physisorption or a chemisorption process. Preferably, the metal-containing compound is chemisorbed on the solid substrate. One can determine if the metal-containing compound chemisorbs to the solid substrate by exposing a quartz microbalance with a quartz crystal having the surface of the substrate in question to the metal-containing compound in the gaseous state. The mass increase is recorded by the eigen frequency of the quartz crystal. Upon evacuation of the chamber in which the quartz crystal is placed the mass should not decrease to the initial mass, but up to one, two or three monolayers of the residual metal-containing compound remains if chemisorption has taken place. In most cases where chemisorption of the metal-containing compound to the solid substrate occurs, the x-ray photoelectron spectroscopy (XPS) signal (ISO 13424 EN—Surface chemical analysis—X-ray photoelectron spectroscopy—Reporting of results of thin-film analysis; October 2013) of M changes due to the bond formation to the substrate.

If the temperature of the substrate in the process according to the present invention is kept below the decomposition temperature of the metal-containing compound, typically a monolayer is deposited on the solid substrate. Once a molecule of the metal-containing compound is deposited on the solid substrate further deposition on top of it usually becomes less likely. Thus, the deposition of the metal-containing compound on the solid substrate preferably represents a self-limiting process step. The typical layer thickness of a self-limiting deposition processes step is from 0.01 to 1 nm, preferably from 0.02 to 0.5 nm, more preferably from 0.03 to 0.4 nm, in particular from 0.05 to 0.2 nm. The layer thickness is typically measured by ellipsometry as described in PAS 1022 DE (Referenzverfahren zur Bestimmung von optischen and dielektrischen Materialeigenschaften sowie der Schichtdicke dunner Schichten mittels Ellipsometrie; February 2004).

A deposition process comprising a self-limiting process step and a subsequent self-limiting reaction is often referred to as atomic layer deposition (ALD). Equivalent expressions are molecular layer deposition (MLD) or atomic layer epitaxy (ALE). Hence, the process according to the present invention is preferably an ALD process. The ALD process is described in detail by George (Chemical Reviews 110 (2010), 111-131).

A particular advantage of the process according to the present invention is that the compound of general formula (I) is very versatile, so the process parameters can be varied in a broad range. Therefore, the process according to the present invention includes both a CVD process as well as an ALD process.

Preferably, after deposition of a metal-containing compound on the solid substrate and before bringing the solid substrate with the deposited metal-containing compound in contact with a reducing agent, the solid substrate with the deposited metal-containing compound is brought in contact with an acid in the gaseous phase. Without being bound by a theory, it is believed that the protonation of the ligands of the metal-containing compound facilitates its decomposition and reduction. Suitable acids include hydrochloric acid and carboxylic acids, preferably, carboxylic acids such as formic acid, acetic acid, propionic acid, butyric acid, or trifluoroacetic acid, in particular formic acid.

Often it is desired to build up thicker layers than those just described. In order to achieve this the process comprising (a) and (b), which can be regarded as one ALD cycle, are preferably performed at least twice, more preferably at least 10 times, in particular at least 50 times. Usually, the process comprising (a) and (b) is performed not more than 1000 times.

The deposition of the metal-containing compound or its contacting with a reducing agent can take from milliseconds to several minutes, preferably from 0.1 second to 1 minute, in particular from 1 to 10 seconds. The longer the solid substrate at a temperature below the decomposition temperature of the metal-containing compound is exposed to the metal-containing compound the more regular films formed with less defects. The same applies for contacting the deposited metal-containing compound to the reducing agent.

The process according to the present invention yields a metal film. A film can be only one monolayer of a metal or be thicker such as 0.1 nm to 1 µm, preferably 0.5 to 50 nm. A film can contain defects like holes. These defects, however, generally constitute less than half of the surface area covered by the film. The film preferably has a very uniform film thickness which means that the film thickness at different places on the substrate varies very little, usually less than 10%, preferably less than 5%. Furthermore, the film is preferably a conformal film on the surface of the substrate. Suitable methods to determine the film thickness and uniformity are XPS or ellipsometry.

The film obtained by the process according to the present invention can be used in an electronic element. Electronic elements can have structural features of various sizes, for example from 100 nm to 100 µm. The process for forming the films for the electronic elements is particularly well suited for very fine structures. Therefore, electronic elements with sizes below 1 µm are preferred. Examples for electronic elements are field-effect transistors (FET), solar cells, light emitting diodes, sensors, or capacitors. In optical devices such as light emitting diodes or light sensors the film obtained by the process according to the present invention serves to increase the refractive index of the layer which reflects light.

Preferred electronic elements are transistors. Preferably the film acts as chemical barrier metal in a transistor. A chemical barrier metal is a material which reduces diffusion of adjacent layers while maintaining electrical connectivity.

The compounds of general formula (I) are particularly suitable as reducing agents in an ALD process. Therefore, the present invention relates to a compound of general formula (I). The same definitions and preferred embodiments as for the process described above apply for the compounds, in particular the preferred examples in table 1.

EXAMPLES

Example 1: Synthesis of I-1

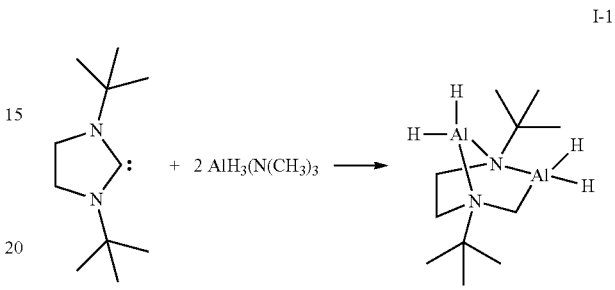

N—N'-di-tert-butyl imidazolidene-2-yl was heated with 2 equivalents of $AlH_3(NMe_3)$ in refluxing toluene until evolution of $NMe_3$ ceased after about 30 min. Evaporation of the solvent allowed isolation of C-1 in 82% yield.

Figure 1:
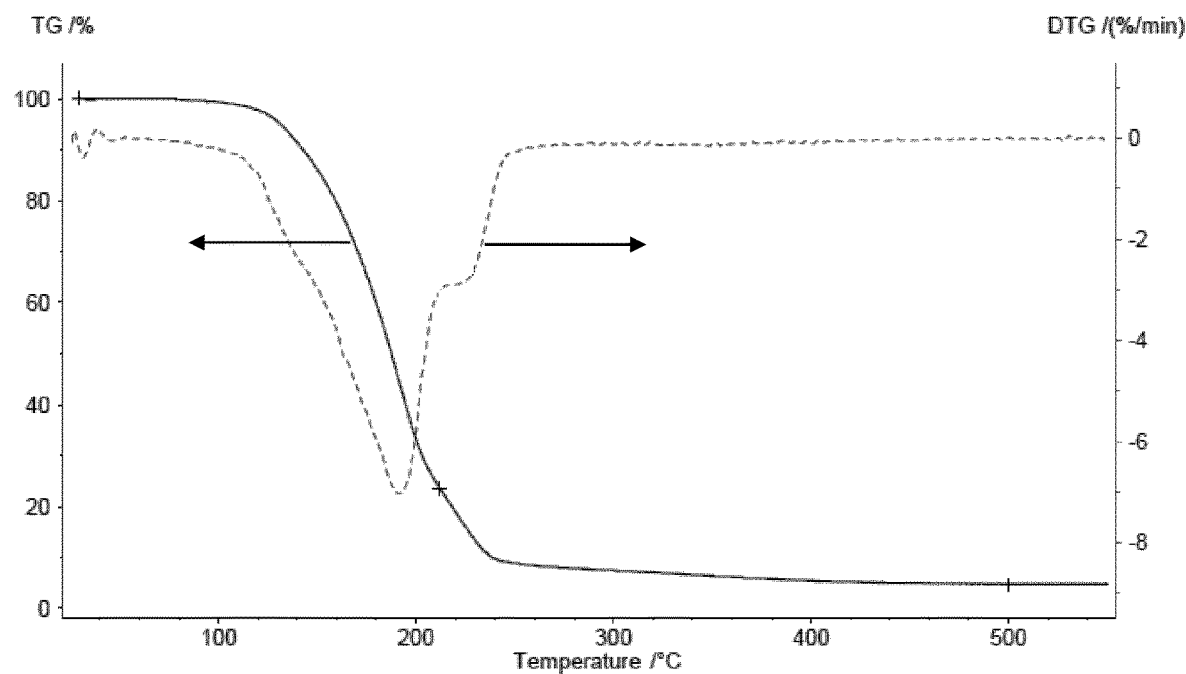
FIG. 1 shows the thermogravimetry (TG) and the differential thermogravimetry (DTG) curves of compound I-1.
Figure 2:
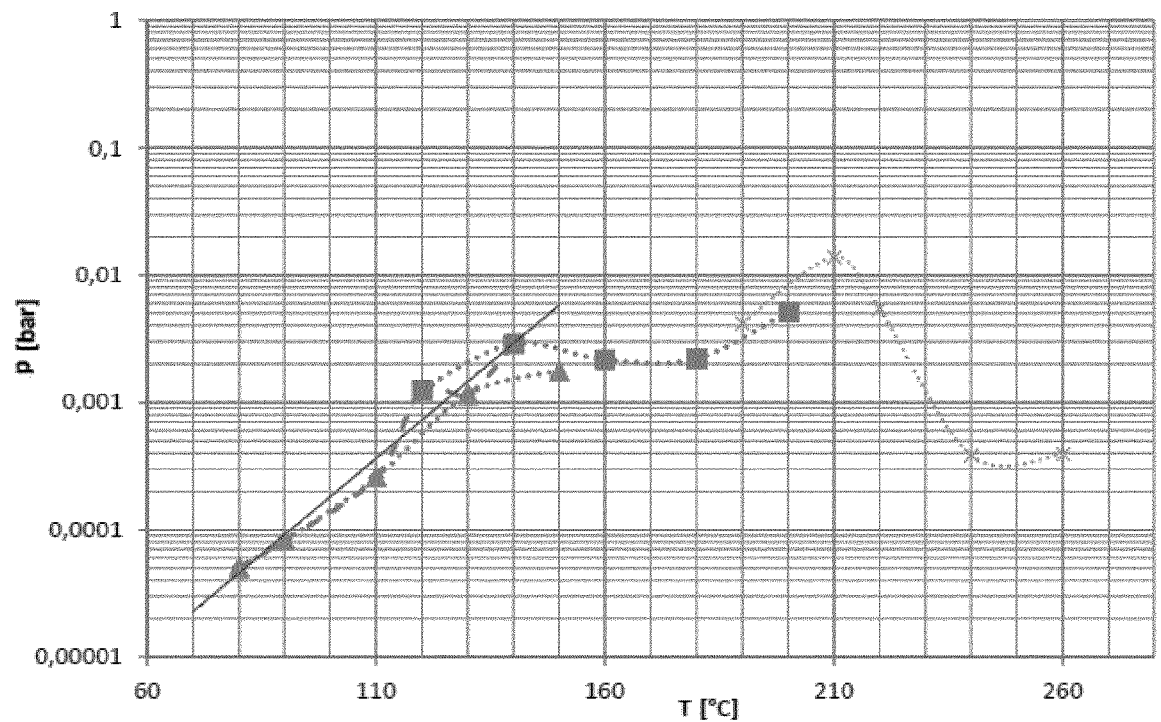
FIG. 2 shows the vapor pressure (P) dependence on the temperature (T) of compound I-1.

The thermogravimetry curve is shown in FIG. 1. The weight loss at 200° C. is 76.6%, at 500° C. it is 95.3%. Vapor pressure measurements are shown in FIG. 2, wherein the triangles, squares and crosses represent results of different measurements and the solid line is a line fit for the results below 150° C.

Figure 3:
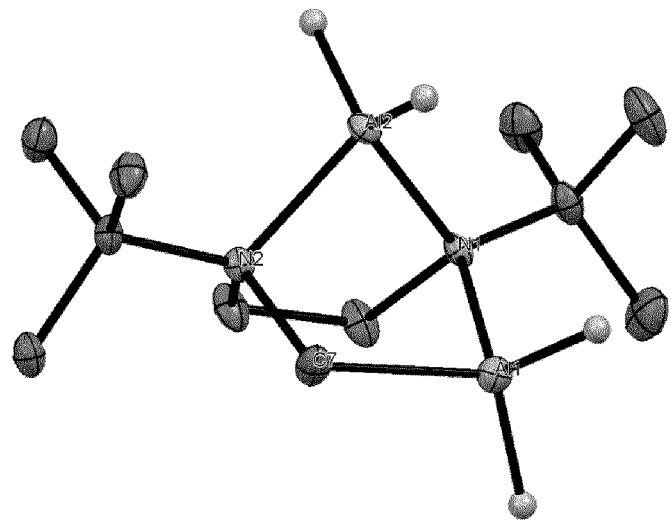
FIG. 3 shows the crystal structure of compound C-1 as obtained from single crystal X-ray diffraction analysis.

Crystals suitable for X-ray diffraction analysis were grown from a concentrated toluene solution at −20° C. The crystal structure is shown in FIG. 3.

Example 2: Al Film Deposition on TiN

A TiN substrate was kept at 140° C. in an ALD apparatus. A supply of $AlCl_3$ was kept at 95° C., a separate supply for compound I-1 was kept at 100° C. 300 cycles were performed, wherein one cycle was: 2 s $AlCl_3$, 20 s nitrogen purge, 3 s compound I-1, 10 s nitrogen purge.

Example 3: Al Film Deposition on Cu

Example 2 was repeated, but instead of TiN, a Cu substrate was used.

Figure 4:
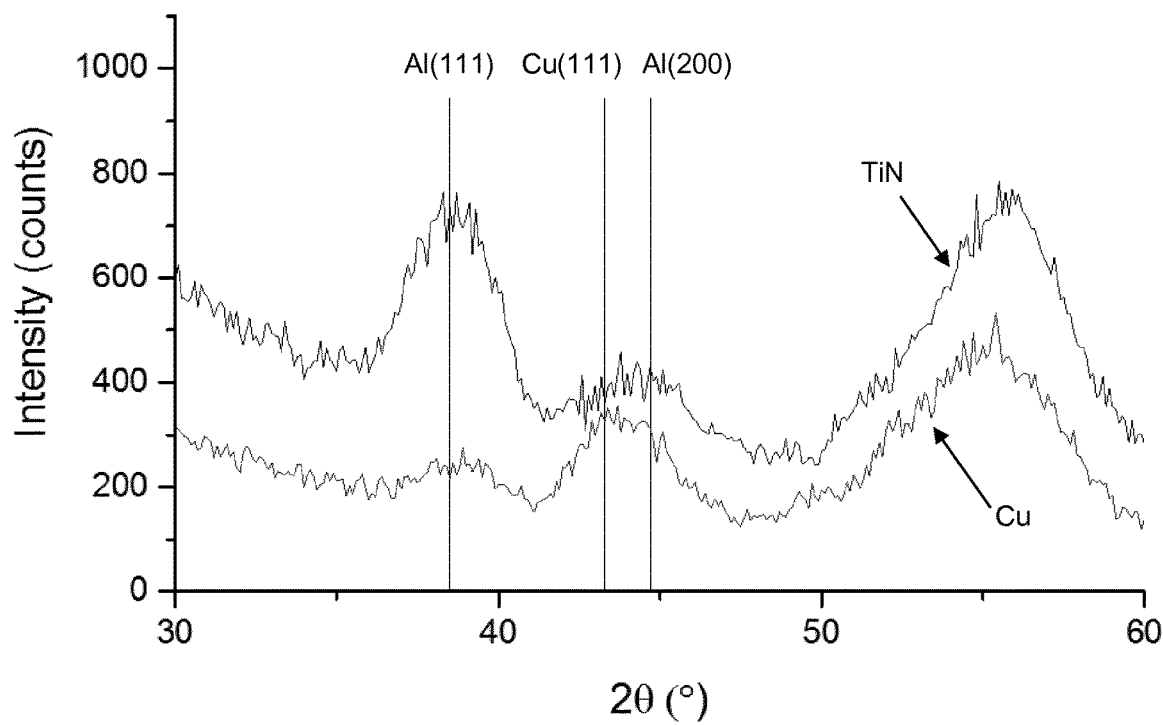
FIG. 4 shows the grazing incidence X-ray diffractogram (GIXRD) for examples 2 and 3.

FIG. 4 shows the grazing incidence X-ray diffractogram (GIXRD) measured under an angle of 1° for both samples obtained in examples 2 and 3. Reflections matching Al metal are indicated in the diffractogram.

The invention claimed is:

1. Process for preparing metal-containing films, the process comprising:
    (a) depositing a metal-containing compound from a gaseous state onto a solid substrate, and
    (b) bringing the solid substrate with the deposited metal-containing compound in contact with a compound of general formula (I)

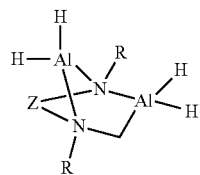 (I)

wherein Z is a $C_2$-$C_4$ alkylene group, and
R is hydrogen, an alkyl group, an alkenyl group, an aryl group, or a silyl group.

2. The process according to claim 1, wherein R comprises no hydrogen atom in the 1-position.

3. The process according to claim 2, wherein R is tert-butyl.

4. The process according to claim 1, wherein Z is ethylene.

5. The process according to claim 1, wherein the compound of general formula (I) has a molecular weight of not more than 600 g/mol.

6. The process according to claim 1, wherein the compound of general formula (I) has a vapor pressure of at least 1 mbar at a temperature of 200° C.

7. The process according to claim 1, wherein (a) and (b) are successively performed at least twice.

8. The process according to claim 1, wherein the metal-containing compound contains Ti, Ta, Mn, Mo, W, or Al.

9. The process according to claim 1, wherein the metal-containing compound is a metal halide.

10. The process according to claim 1, wherein a temperature does not exceed 350° C.

11. A compound of general formula (I),

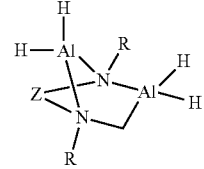 (I)

wherein Z is a $C_2$-$C_4$ alkylene group, and
R is hydrogen, an alkyl group, an alkenyl group, an aryl group, or a silyl group.

12. The compound according to claim 11, wherein R comprises no hydrogen atom in the 1-position.

13. The compound according to claim 12, wherein R is tert-butyl.

14. The compound according to claim 11, wherein Z is ethylene.

* * * * *